United States Patent [19]

Kakimoto

[11] Patent Number: 4,909,678
[45] Date of Patent: Mar. 20, 1990

[54] BORING APPARATUS FOR A LAMINATED PLATE AND BORING CUTTER

[75] Inventor: Masakazu Kakimoto, Aichi, Japan

[73] Assignee: Ushio Co, Ltd., Aichi, Japan

[21] Appl. No.: 236,755

[22] Filed: Aug. 26, 1988

[30] Foreign Application Priority Data

Aug. 31, 1987 [JP] Japan ............................. 62-133541
Aug. 31, 1987 [JP] Japan ............................. 62-133542
Aug. 31, 1987 [JP] Japan ............................. 62-218741

[51] Int. Cl.$^4$ ...................... B23B 35/00; B23B 47/22; B23B 51/06
[52] U.S. Cl. ........................... 408/1 R; 407/11; 408/3; 408/57; 408/59; 408/67; 408/95; 408/130; 408/213
[58] Field of Search .............. 408/1 R, 3, 17, 57, 408/59, 95, 98, 228, 213, 704, 51, 56, 67, 68, 87, 124, 130; 407/53, 54, 11

[56] References Cited

U.S. PATENT DOCUMENTS

| | | | |
|---|---|---|---|
| 2,718,689 | 9/1955 | Mason et al. | 407/54 X |
| 3,120,136 | 2/1964 | Bieker | 408/98 X |
| 3,663,114 | 5/1972 | Welsh et al. | 408/3 |
| 4,280,775 | 7/1981 | Wood | 408/3 |
| 4,338,050 | 7/1982 | Ozer et al. | 408/1 R |
| 4,697,964 | 10/1987 | Daiko et al. | 408/704 |
| 4,725,171 | 2/1988 | DeTorre | 408/213 |

OTHER PUBLICATIONS

"A Guide to Cutting and Machining Kevlar Aramid", E. I. du Pont de Nemours and Co., published prior to Jul., 1982.

Primary Examiner—Steven C. Bishop
Attorney, Agent, or Firm—Sandler & Greenblum

[57] ABSTRACT

An apparatus for boring a laminated plate includes a table having a first surface on which a laminated plate may be placed for boring and an opposing second surface, the table defining at least one passage therethrough; a supporting pad for urging a laminated plate to be bored towards the first surface of the table; and a cutter for boring a laminated plate to be bored, the cutter operable to bore in a direction generally opposite to the direction that the supporting pad urges and through the passage defined by the table. Further according to the present invention, the cutter includes a knife edge, a pivotal mechanism adapted to be pivoted about its axial center line, and a stepping mechanism for moving the knife edge in one direction and unsuccessively further in a second direction so that successively deeper boring may be performed. Also according to the present invention, a boring cutter having an axial center line about which the cutter is operable to be rotated includes a cutting element having a modified round-bar shape. Still further, according to the present invention, a method of boring a multi-layer laminated plate includes the steps of pressing against the plate in one direction; and boring the the plate in a direction opposite to the direction in which it is pressed, the boring characterized in that a boring element is withdrawn between boring of each individual layer of the multi-layer plate.

60 Claims, 6 Drawing Sheets

BORING APPARATUS FOR A LAMINATED PLATE AND BORING CUTTER

BACKGROUND OF THE INVENTION

1. Field of the Invention

The present invention relates to a boring apparatus for laminated plates and more, particularly, to a boring apparatus that is especially suitable for boring multi-layer plates.

2. Description of the Prior Art

A multi-layered substrate has been recently employed to form an electronic circuit within a limited area and volume.

To produce a multi-layered substrate, a prepreg (i.e., an insulating material in which two surfaces with spun glass fibers woven thereon are coated with uncured epoxy resin) is sandwiched between substrates and then subjected to pressing and heating. To accurately position the prepreg with respect to the substrates, it is necessary to bore holes in the prepreg, in advance, with the holes being adapted for receiving reference pins. Prepregs are normally bored in a multi-layer, packaged form to prevent contamination which leads to defective energization. In addition, copper foils are coated on upper and lower surfaces of the multi-layered substrate, and these copper foils also need be bored in advance.

Thin plates which need to be bored in advance, other than the prepreg and copper foils described above, are increasingly being used in a number of technical fields. Therefore, a need has arisen for development of means capable of accurately boring holes in such materials.

One heretofore known means for boring thin plates such as prepregs, copper foils and the like, is press means. Press means involves placing plates, one by one, on a press, and then punching the plates with a die. This poses a problem in that the efficiency of boring work is low, resulting in contamination of both sides of the plate. Another problem, especially for the aforesaid prepreg, is that a package needs to be unpacked to prevent contamination.

Another conventional boring means is drilling means. The use of drilling means involves placing plates in a laminated fashion on a drilling machine and cutting and boring them by means of a drill having a spiral groove or the like. This has an advantage in that the efficiency of boring work is good and less contamination in plates occurs, at least as compared with the aforementioned press means. However, a separate problem is created, in terms of work accuracy, in that the plates become fused together due to frictional heat between the drill and the plate, and chips thereby become fused around bored holes. Particularly, since the copper foil is pliable in nature, there is a problem in that distortion or burrs occur around a bored hole. A further problem is that since chips of the like are scattered due to the rotation of a drill or the like, maintenance of the drilling apparatus, especially cleaning, is time-consuming. Chips not cleaned away can adhere to parts of the drilling apparatus and lessen the durability thereof.

SUMMARY OF THE INVENTION

The present invention has been developed in order to solve the aforementioned problems. It is an object of the present invention to provide an apparatus for boring a laminated plate that can bore a thin plate with high accuracy, which is easy to maintain, and which has good durability. It is another object of the present invention to provide a boring cutter having these same characteristics.

To achieve the aforementioned objects, an apparatus for boring a laminated plate according to the present invention comprises a table having a work window forming an opening therethrough and a multi-layered laminated plate placed thereon. This apparatus also comprises a supporting pad for pressing and supporting the laminated plate from the upper side of the work window, and a cutter for subjecting the laminated plate to boring work from the under side of the work window, the cutter having a knife edge obtained by cutting a round bar in a direction which is obliquely to an axis of the bar, the cutter having a pivotal mechanism adapted to be pivoted about an axial center line and a stepping mechanism adapted to be moved upwardly and downwardly so as to serially bore work having one or more laminated plates attached thereto.

In the aforementioned structure, the cutter bores a laminated plate so as to circularly cut off portions with the knife edge. The cutter, the pivotal mechanism and the stepping mechanism operate in unison to minimize chip occurrence, to perform boring naturally and accurately, to facilitate chip removal, and to prevent occurrence of distortion and burrs around holes and fusion of chips and cut pieces. Thus, boring precision is increased.

Moreover, the cutter is preferably formed with an air path for discharging air toward the tip of the knife edge thereof. The air path of the cutter has, as its object, the discharge of air towards a bored portion, to assist in removing the chips and cut pieces, and to cool the bored portion to prevent the deposition of the plates with each other and the like so as to enhance the boring accuracy. Furthermore, preferably, an accommodating chamber is provided around the cutter at the lower side of the work window, and a vacuum mechanism is attached to the accommodating chamber. The accommodating chamber is designed to accommodate the removed chips and the like therein, and the vacuum mechanism is designed to discharge the chips and the like outside the apparatus, to prevent the chips and the like from adhering to various parts of the apparatus, and to facilitate maintenance so as to improve durability.

According to one aspect of the present invention, an apparatus for boring a laminated plate is provided which includes a table having a first surface on which a laminated plate may be placed for boring, and an opposing second surface, the table defining a work window opening therethrough, which opening interconnects the first and second surfaces thereof; a supporting pad for pressing a laminated plate to be bored toward the first surface of the table; and a cutter for boring a laminated plate to be bored, the cutter operable to bore in a direction generally opposite to the direction that the supporting pad presses and through the work window opening defined by the table. Further, according to the present invention, the cutter includes a knife edge, a pivotal mechanism adapted to be pivoted about an axial center line, and a stepping mechanism adapted to be moved upward and downward so that serial boring may be performed. Of course, the first surface may be an upper surface, the second surface may be a lower surface, the supporting pad may press generally downward, and the cutter may bore generally upward. The knife edge may have an obliquely-cut round-bar shape, a concave cutting surface, or portions defining an air passage therethrough. In the latter case, assuming that the knife edge has a cutting point, the air path may have a discharge opening in the vicinity of that cutting point. Still further, according to the present invention, the supporting pad may have portions defining an air passage therethrough. In such case, the air passage through the supporting pad may have a discharge opening located so that discharged air may impinge on a laminated plate.

An apparatus according to the present invention for boring a laminated plate includes a table having a first surface on which a laminated plate may be placed for boring and an opposing second surface, the table defining a work window opening therethrough, which opening interconnects the first and second surfaces thereof; a supporting pad for pressing a laminated plate to be bored towards the first surface of the table; a cutter for boring a laminated plate to be bored, the cutter operable to bore in a direction generally opposite to the direction the supporting pad presses and through the work window opening defined by the table, the cutter being located on a cutter side of the table; elements defining and accommodating chamber for chips in the like, the accommodating chamber being located on the cutter side of the work window; and a vacuum mechanism attached to the accommodating chamber. Of course, the first surface may be an upper surface, the second surface may be a lower surface, the supporting pad may press generally downward, and the cutter may bore generally upward. The knife edge may have an obliquely-cut round-bar shape, a concave cutting surface, and/or an air path therethrough. If the knife edge does have an air path, the air path may have a discharge opening in the vicinity of a cutting point of the knife edge. Further, the supporting pad may have portions defining an air passage therethrough and, still further, the supporting pad may have a discharge opening located so that discharged air may impinge on a laminated plate.

According to the present invention, a boring cutter having an axial center line about which the cutter is operable to be rotated may include a cutting element having a modified round-bar shape. The cutting element may have an obliquely-cut round-bar shape, it may have a concave cutting edge, and/or it may have portions defining an air passage therethrough. The cutter element may have a pointed end. Assuming that the cutter element has a pointed end and an air passage therethrough, the cutter element may further have a discharge opening in the vicinity of the pointed end.

According to the present invention, a method of boring a multi-layer laminated plate includes the steps of pressing against the plate in one direction; boring the plate in a direction opposite of the direction in which it is pressed, the boring characterized in that a boring element is withdrawn between boring of each individual layer of the multi-layer plate. According to the present invention, a method of boring a multi-layer laminated plate may also include the step of blowing air towards the laminated plate in the direction which it is bored and/or blowing air towards the laminated plate in a direction which it is pressed. In the present invention, blown air may pass through the boring element. According to the present invention, a method for boring a multi-layer laminated plate may further include the step of vacuuming away bored portions of the laminated plate.

According to the present invention, a boring apparatus for a laminated plate includes a table having a first surface on which a laminated plate may be placed for boring and an opposing second surface, the table defining at least one passage therethrough; means for urging a laminated plate to be bored toward the first surface of the table; and a cutter for boring a laminated plate to be bored, the cutter operable to bore in a direction generally opposite the direction that the means for urging urges and through the passage defined by the table. According to the present invention, the cutter includes a cutting element having an axial center line, the cutting element adapted to be rotated about its axial center line, the cutting element further adapted to be moved in both directions along its axial center line; means for rotating the cutting element about its axial center line; and means for moving the cutting element in both directions along its center line.

The means for rotating the cutting element about its axial center line may include a motor (e.g., an air motor) having a rotating output shaft. In such a case, an apparatus according to the present invention would likely also include means for connecting the cutting element and the rotating output shaft of the air motor. This means for connecting the cutting element and the rotating output shaft of the air motor may have an air passage therethrough.

The means for moving the cutting element in both directions along its axial center line may include a stepping mechanism. Of course, in such an embodiment of the present invention, the means for rotating the cutting element about its axial center line may include an air motor having a rotating output shaft and means for connecting the cutting element and the rotating output shaft of the air motor may also be present. In addition, an apparatus according to the present invention may also include means for connecting the air motor to the stepping mechanism.

The cutting element, air motor, and stepping mechanism may all be disposed in a unit box and an apparatus according to the present invention may include means for moving that unit box, e.g., a threaded bar.

An apparatus according to the present invention may also include means for controlling operation of the supporting pad and cutter so that those elements operate in unison. This means may include CPU. Such a CPU may also control movement of a unit box.

According to the present invention, a boring apparatus for a laminated plate includes a table having a first surface on which a laminated plate may be placed for boring and an opposing second surface, the table defining at least one passage therethrough; means for urging a laminated plate to be bored towards the first surface of the table; and a cutter for boring a laminated plate to be bored, the cutter operable to bore in a direction generally opposite the directions that the means for urging urges and through the passage defined by the table, elements defining an accommodating chamber for ships and the like; and a vacuum mechanism attached to the accommodating chamber. According to the present invention, the cutter includes a cutting element having an axial center line, the cutting element adapted to be rotated about its axial center line, the cutting element further adapted to be moved in both directions along its axial center line; means for rotating the cutting element about its axial center line; and means for moving the cutting element in both directions along its center line.

The means for rotating the cutting element about its axial center line may include a motor having a rotating output shaft. The motor may be an air motor. In such a case, an apparatus according to the present invention may also include means for connecting the cutting element and the rotating output shaft of the air motor may have an air passage therethrough.

The means for moving the cutting element in both directions along its axial center line may include a stepping mechanism. Of course, in such an embodiment of the present invention, the means for rotating the cutting element about its axial center line may include an air motor having a rotating output shaft and means for connecting the cutting element and the rotating output shaft of the air motor may also be present. In addition, an apparatus according to the present invention may also include means for connecting the air motor to the stepping mechanism.

BRIEF DESCRIPTION OF THE DRAWINGS

The above and other objects, features and advantages of the present invention will be described hereinafter with respect to the accompanying drawings, in which, like reference numerals represent similar parts throughout the several wherein.

DETAILED DESCRIPTION OF THE PREFERRED EMBODIMENTS

An embodiment of an apparatus for boring a laminated plate according to the present invention will be described hereinafter with reference to the accompanying drawings.

Figure 1:
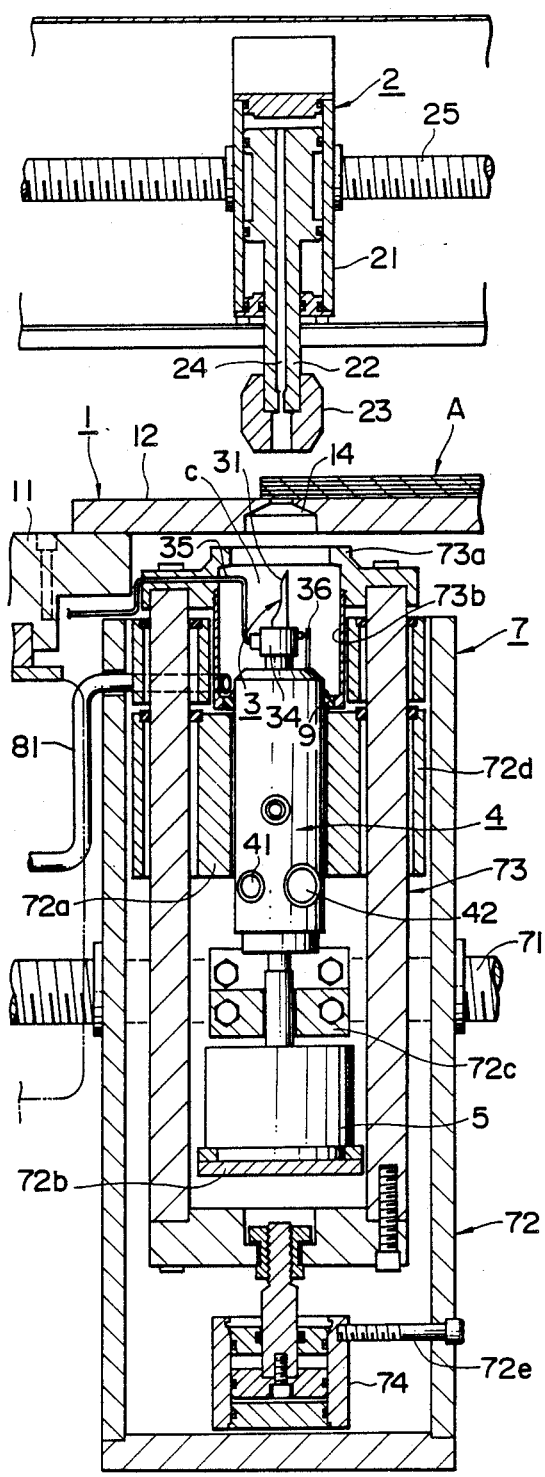
FIG. 1 is a sectional view showing an embodiment of an apparatus for boring a laminated plate according to the present invention.

In this embodiment, the apparatus comprises, as shown in FIG. 1, a table 1, a supporting pad 2, a cutter 3 and an accommodating chamber C, the cutter 3 having a pivotal mechanism 4 and a stepping mechanism 5 attached thereto, the accommodating chamber C having a vacuum mechanism 8 attached thereto.

Figure 6:
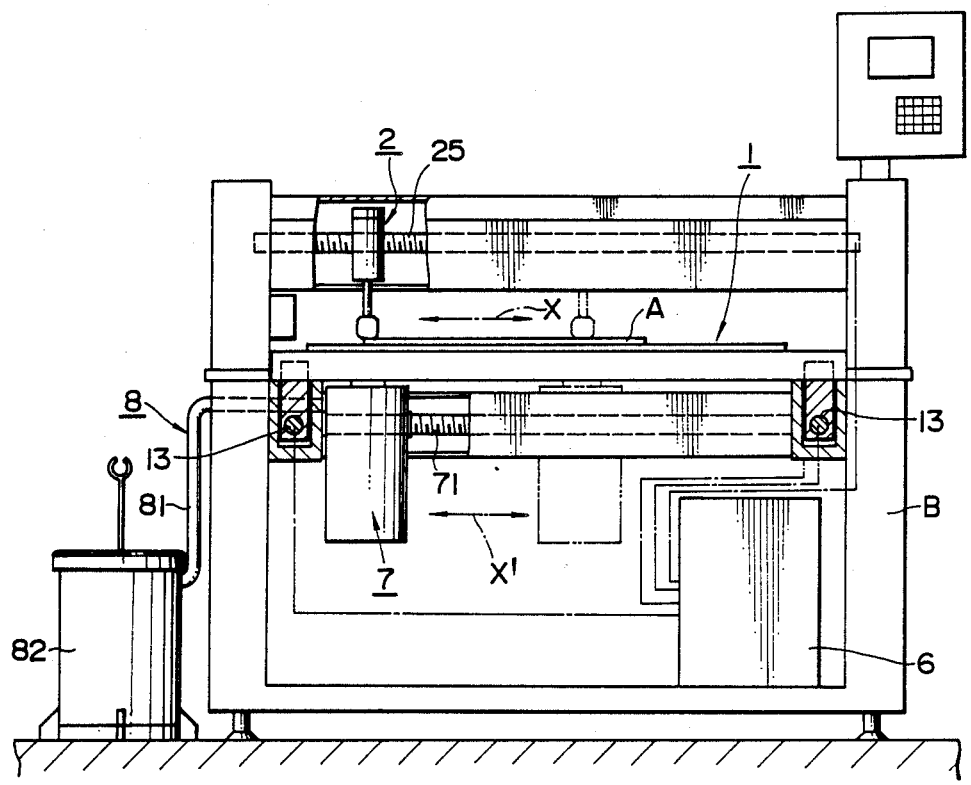
FIG. 6 is a front view of the entire apparatus, including respective portions of the apparatus used for boring a laminated plate according to the present invention.

Table 1 comprises a sliding table 11 and work table 12. Referring now also to FIG. 6, sliding table 11 is movably provided on a machine body B through a moving mechanism 13, the moving mechanism 13 being formed from a threaded bar or the like and capable of moving the sliding table 11 in a lateral direction (i.e., toward and away from a viewer of the drawing). The work table 12 is secured to the sliding table 11. Sliding table 11 has a funnel-like work window 14 passing therethrough downwardly in a predetermined location.

A supporting pad 2 is provided to press and support the laminated plate A toward the table 1 (work table 12) from the upper side of the work window 14, and comprises an air cylinder 21, a rod 22 connected to the air cylinder 21 and a cushion material 23 secured to the extreme end of the rod 22. The air cylinder 21 applies the pressing force toward the laminated plate A with respect to the rod 22 and the cushion 23, which in turn forms a buffer by which the surface of the laminated plate A is prevented from being damaged by the pressing force. The rod 22 and cushion 23 are interiorly provided with an air path 24 in communication with the air cylinder 21 so that air is discharged from the air cylinder 21 toward the laminated plate A. The supporting pad 2 is provided on the machine body B through a moving mechanism 25, which is formed from a threaded bar or the like similar to the moving mechanism 13 of the table 1 and capable of moving the supporting pad 2 in a lateral direction indicated by double-headed arrow X in FIG. 6.

A cutter 3 performs the boring work for the laminated plate A from the underside of the work window 14 and comprises a knife edge 31 such as could be obtained by cutting a round bar in a direction obliquely to the axis thereof and by making the cut surface concave. The cutter also comprises an air path 32 bored from the extreme end of the knife edge 31 toward a body portion of the edge. A nut 34 formed with a communication passage 33 internally therearound is fitted around the body portion of the cutter 3, and a tube 35 connected to an air pump (not shown) is connected to the nut 34 so that air may be discharged from the extreme end of the knife edge 31. This nut 34 is secured by means of a pin 36 to the pivotal mechanism 4 which will be described later.

The pivotal mechanism 4 causes the cutter 3 to be pivotally moved around the axial center line thereof and comprises an air motor. The air motor is interiorly provided with a blade (not shown) secured to a rotational shaft (not shown) so that the blade and the rotational shaft may be rotated by air, which is supplied from an air opening 41 and discharged from a discharge opening 42. The cutter 3 is secured to a mounting chuck 43 connected to the rotational shaft.

The stepping mechanism 5 causes the cutter 3 including the pivotal mechanism 4 to be moved upward and downward and comprises a pulse motor connected to the pivotal mechanism 4. The pulse motor is controlled in its operating range or the like by a controller 6. The operating mode for temporarily moving down the cutter 3 between each of a series of boring operations by the cutter 3 is set by the controller 6. Controller 6 may be a CPU.

The accommodating chamber C is provided around the cutter 3 underside of the work window 14 and is composed of the upper portion of a lift frame 73, which will be described later.

The cutter 3, the pivotal mechanism 4 the stepping mechanism 5 and the accommodating chamber C are disposed or accommodated within a unit box 7, which is provided on the machine body B through a moving mechanism 71 formed from a threaded bar or the like similar to the aforesaid moving mechanisms 13 and 25. The moving mechanism 71 causes the unit box 7 to be moved in a direction as indicated by double-headed arrow X', and is interlocked with the moving mechanism 25 of the supporting pad 2 by the controller 6.

The unit box 7 is provided, in addition to the moving mechanism 71, with a housing 72, a lift frame 73 and an air cylinder 74. The housing 72 is formed from a hollow body constituting an outer portion of the unit box 7 and interiorly provided with a guide 72a for upward and downward movement of the pivotal mechanism 4, a fixing bed 72b and a guide 72c for the stepping mechanism 5, a guide 72d for upward and downward movement of a lift frame 73 described further below. The lift frame 73 is provided so that it may be moved upward and downward within the housing 72, and a contact portion 73a in contact with the lower surface of the work table 12 to encircle the work window 14 is mounted on the upper portion of the lift frame 73, said contact portion 73a having a tube 73b mounted thereon so as to surround the upper portions of the cutter 3 and the pivotal mechanism 4. The contact portion 73a and the tube 73b constitute the aforesaid accommodating chamber C. A seal 9 is interposed between the tube 73b and pivotal mechanism 4 in order to improve a sealing performance. The air cylinder 74 is secured to the bottom of the housing 72 by means of a fixing bolt 72e and comprises a source for moving the lift frame 73 upward and downward.

The vacuum mechanism 8 comprises a tube 81 connected to the accommodating chamber C and drawn from the unit box 7, and a vacuum pump 82 having an accumulation box with a filter connected to the tube 81 outside the machine body B. The interior of the accommodating chamber C is drawn by the suction force of the vacuum pump 82 through the tube 81.

In an embodiment having been constructed as described above, during boring operation, the laminated plate A is first placed on the upper surface of the work table 12. In the case of a prepreg packaged as mentioned above, it is placed without unpacking. After the laminated plate A has been placed, the moving mechanism 25 and 71 are operated by the control of the controller 6 whereby the supporting pad 2 and the cutter 3 (the unit box 7) are positioned on the center line of the work window 14 of the work table 12 as shown in FIG. 1.

Figure 2:
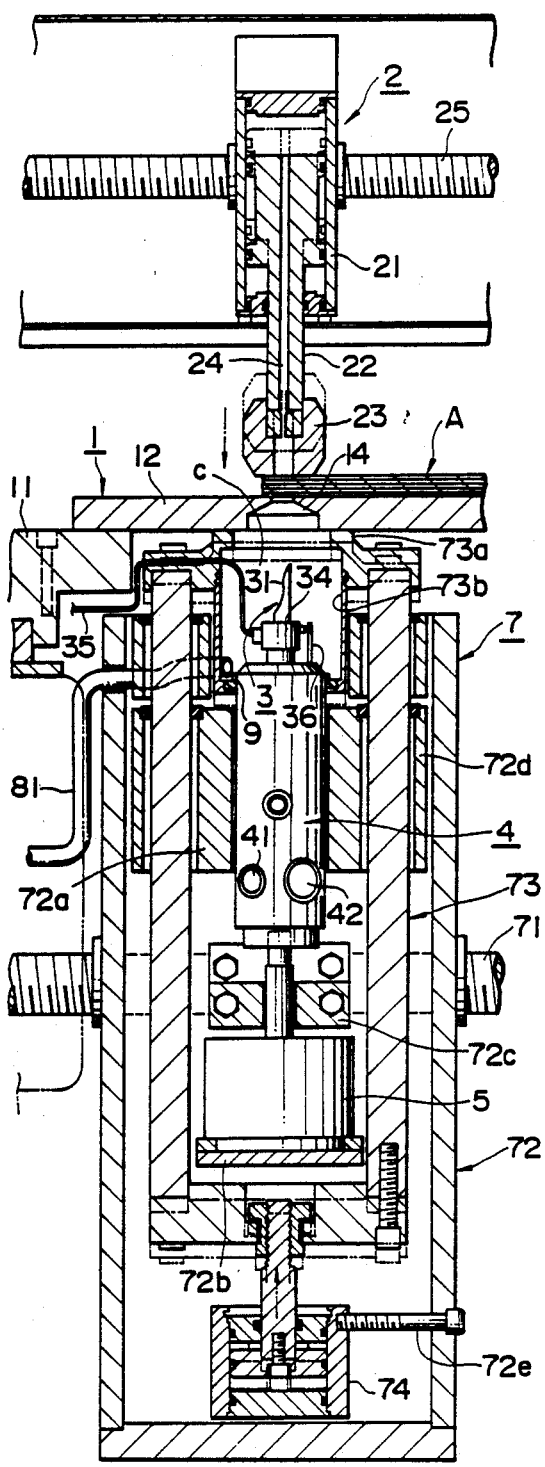
FIG. 2 is a sectional view showing the initial stage of operation of the apparatus of FIG. 1.
Figure 3:
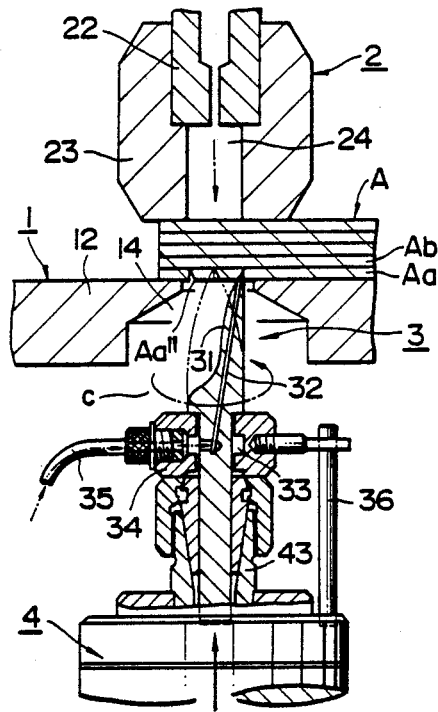
FIGS. 3 and 4 are, respectively, enlarged views showing essential steps of the operation subsequent to that shown in FIG. 2.
Figure 4:
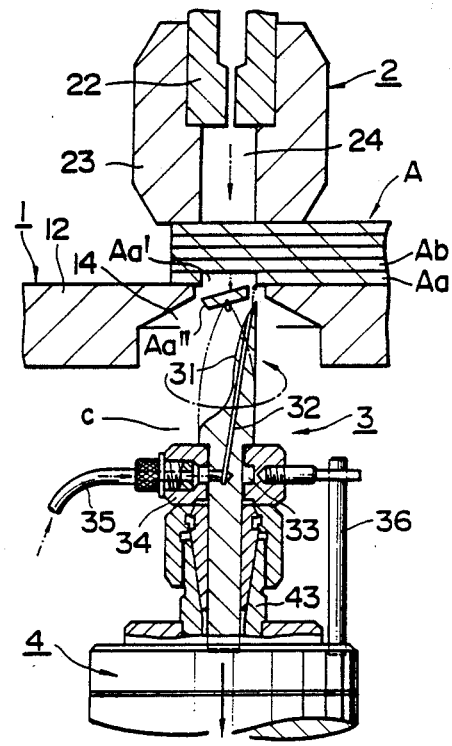

The boring work starts from the state shown in FIG. 1 as mentioned above. As shown in FIG. 2, first, the air cylinder 74 within the unit box 7 is actuated to move the lift frame 73 upward to bring the contact portion 73a of the lift frame 73 into contact with the lower surface of the work table 12, and the accommodating chamber C encircled and formed by the contact portion 73a and tube 73b is completely sealed by the lower surface of the work table 12. Thereafter, the pivotal mechanism 4 is actuated to turn the cutter 3, and the stepping mechanism 5 is actuated to move the cutter 3 upward. The cutter 3 is rotated while discharging air as shown in FIG. 3 to bore only the lowermost layer, the plate Aa, of the laminated plate A. See FIGS. 4 and 5. During a continuing boring operation, after termination of the boring of the lowermost layer plate Aa, the stepping mechanism 5 is actuated to move the cutter 3 down as shown in FIG. 4. After the temporary downward movement of the cutter 3, the stepping mechanism 5 is further actuated to move the cutter 3 upward to bore the next layer, the plate Ab. In this way, the entire laminated plate A is bored. In this boring step, the operation of the stepping mechanism 5 or the like is controlled by the controller 6. The operation of the stepping mechanism 5 may also be set to the controller 6 so that two or several plates Aa and Ab may be serially bored depending upon the material of the laminated plate A or the like.

When the boring work in conjunction with a single work window 14 is terminated as described above, the lift frame 73 is moved down, and the elements reposition themselves (as shown in FIG. 1) around another work window 14 by movement of the supporting pad 2 and the cutter 3 (unit box 7) in the X direction caused by the moving mechanisms 27 and 71, and by movement of the sliding table 11 (work table 12) in the lateral direction (i.e., toward or away from a viewer) caused by the moving mechanism 13. It is noted that the movement thereof to another work window 14 is also controlled by the controller 6.

In the aforementioned boring work, the plate "Aa" of the laminated plate A is bored so as to cut it off by the knife edge 31 with a distinctive feature of the cutter 3 and the rotation thereof. Therefore, stress of a cutting force of the knife edge 31 of the cutter 3 is not deflected and concentrated around a hole Aa" to be bored; even if material of the laminated plate A is pliable like said copper foil, distortion or burr will not occur around the hole Aa; and occurrence of chips is minimized. In the case of the aforementioned packaged prepreg, a package material becomes bored at the same time in boring the lowermost layer plate Aa.

Figure 5:
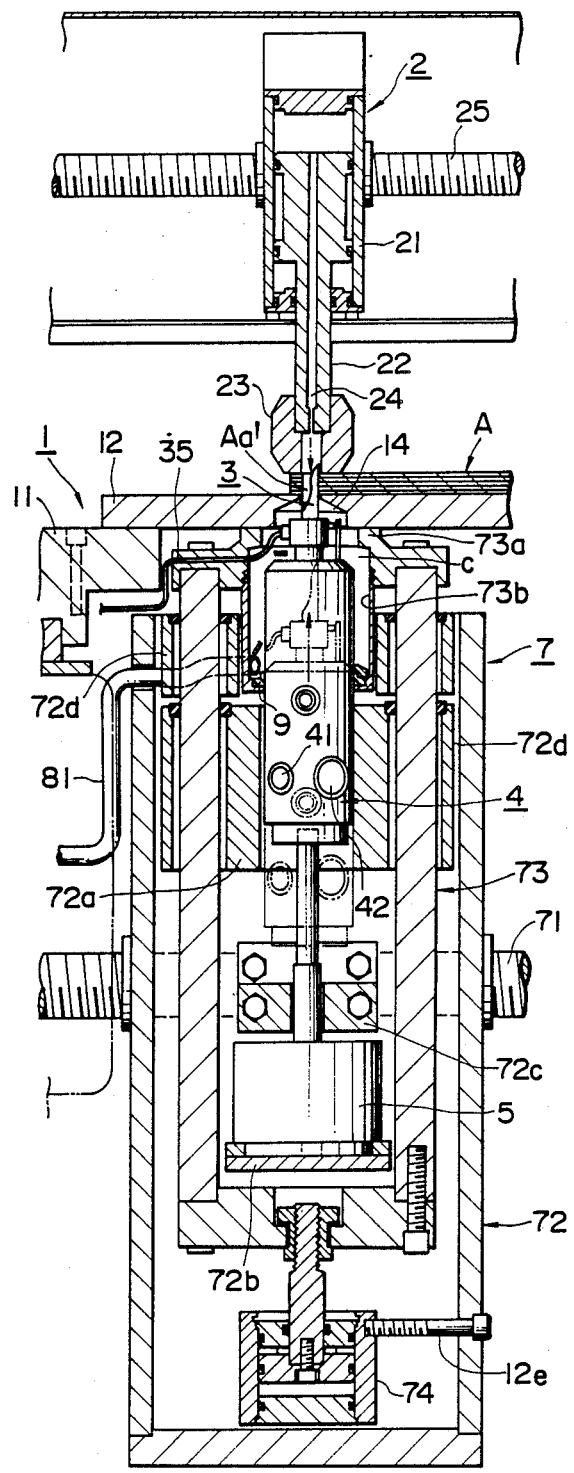
FIG. 5 is a sectional view showing the completion state of operation of the apparatus.

Furthermore, since the boring work is carried out from the lower side of the laminated plate A, cut pieces Aa" and chips caused by boring fall due to their own weight and are naturally removed. In the removal of the cut pieces Aa" and chips, air discharged from the extreme end of the knife edge 31 of the cutter 3 performs wiping cleaning in assisting the removal while preventing adhesion of the cut pieces Aa" and chips to and around the hole Aa'. When boring is terminated as shown in FIG. 5, air discharged from the air path 24 of the supporting pad 2 flows into the hole Aa'. Therefore, the wiping cleaning to and around the hole Aa' is carried out also by this air. Moreover, downward movement of the cutter 3 between each of a series of boring operations prevents the cut piece Aa" from being sandwiched between the cutter 3 and the hole Aa'. The thus removed cut pieces Aa" and chips are received into the accommodating chamber C, pass through the tube 81 and are discharged outside by the suction of the vacuum pump 82. Therefore, they are prevented from being scattered and from adhering to various parts of the apparatus.

Moreover, the air discharged from the extreme end of the knife edge 31 of the cutter 3 cools around the hole Aa' to prevent fusion of the chips around the hole Aa' and fusion of the plates Aa and Ab. This fusion prevention can be enhanced by changing air into cool air by means of a heat exchanger or the like. Air discharged from the supporting pad 2 also assists this cooling.

Other than the above-described embodiments, other actuators may be employed for the pivotal mechanism 4, the stepping mechanism 5 and the like. In addition, in case of small-scaled boring, manual control in place of control by the controller 6 may be employed.

Figure 7:
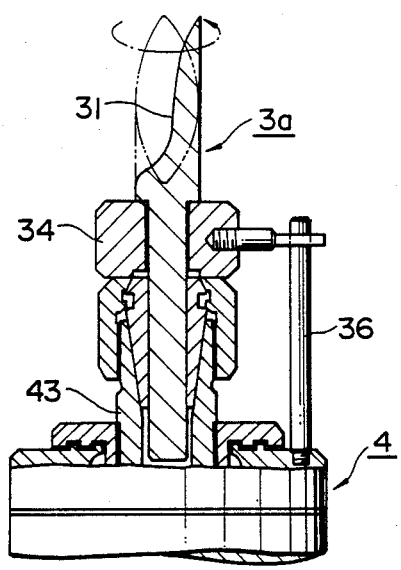
FIGS. 7 to 9 are sectional views showing modified forms of the cutter.
Figure 8:
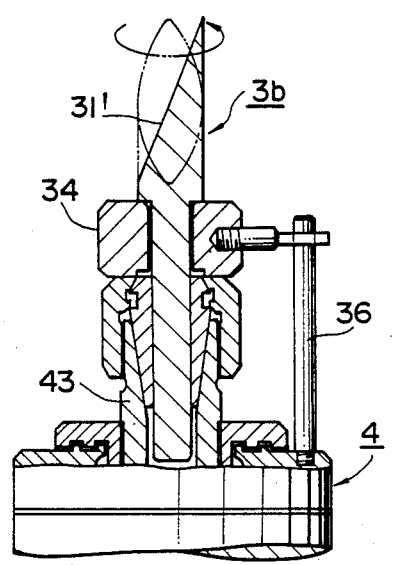
Figure 9:
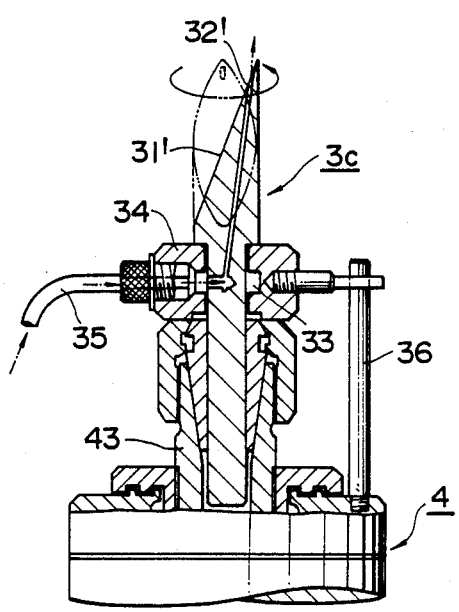

FIGS. 7 to 9 show modified forms of the aforementioned cutter 3. FIG. 7 shows a construction in which a cutter 3a is not provided with the air path 32 in the cutter 3; FIG. 8 shows a construction in which a cutter 3b has a cutting surface of a knife edge 31' in the form of an inclined flat surface instead of a concave surface; and FIG. 9 shows a construction in which a cutter 3c is formed with an air path 32' in the knife edge 31' of the cutter 3b.

It is to be noted that in the present invention, not only the aforesaid cutters 3, 3a, 3b and 3c, but also modified from thereof can be used.

As described above, in the apparatus for boring a laminated plate according to the present invention, the fusion of chips and fusion of the laminated plate itself are prevented and, in addition, occurrence of distortion and burrs is prevented. Thus, the present invention operates to bore laminated plates with excellent accuracy.

Moreover, since chips or the like are not scattered and/or allowed to adhere to various parts of the apparatus, maintenance, i.e., cleaning, is easily accomplished and excellent durability is obtained.

Clearly, numerous modifications and variations are possible in light of the above teachings. It is therefore to be understood that within the scope of the appended claims, the invention may be practiced otherwise than as specifically described.

I claim:

1. An apparatus for boring a laminated plate comprising:
   (a) a table having a first surface on which a laminated plate may be placed for boring and an opposing second surface, said table defining at least one passage therethrough;
   (b) a supporting pad for urging a laminated plate to be bored towards the first surface of said table; and
   (c) a cutter for boring a laminated plate to be bored, said cutter operable to bore in a direction generally opposite to the direction that the supporting pad urges and through the passage defined by said table, said cutter comprising:
      (i) a knife edge having a cutting point adjacent one end and an air passage having a discharge opening in the vicinity of said cutting point;
      (ii) a pivotal mechanism having an axial center line, said pivotal mechanism adapted to be pivoted about its axial center line; and
      (iii) a stepping mechanism for moving the knife edge in one direction and successively further in a second direction so that successively deeper boring may be performed.

2. An apparatus as recited in claim 1, wherein the first surface is an upper surface, the second surface is a lower surface, the supporting pad presses generally downward, and the cutter bores generally upward.

3. An apparatus as recited in claim 2, wherein said knife edge has an obliquely-cut round-bar shape.

4. An apparatus as recited in claim 2, wherein said knife edge has a concave cutting surface.

5. An apparatus as recited in claim 2, wherein said supporting pad has portions defining an air passage therethrough.

6. An apparatus as recited in claim 5, wherein said the air passage through said supporting pad has a discharge opening located so that discharged air may impinge on the laminated plate.

7. An apparatus for boring a laminated plate comprising:
   (a) a table having a first surface on which a laminated plate may be placed for boring and an opposing second surface, said table defining at least one passage therethrough;
   (b) a supporting pad for urging a laminated plate to be bored towards the first surface of said table;
   (c) a cutter for boring a laminated plate to be bored, said cutter operable to bore in a direction generally opposite to the direction the supporting pad urges and through the passage defined by said table, said cutter being located on a cutter side of the table, said cutter comprising:
      (i) a knife edge having a cutting point adjacent one end and an air passage having a discharge opening in the vicinity of said cutting point;
      (ii) a pivotal mechanism having an axial center line, said pivotal mechanism adapted to be pivoted about said axial center line, and
      (iii) a stepping mechanism for moving the knife edge in one direction and successively further in a second direction so that successively deeper boring may be performed;
   (d) elements defining an accommodating chamber for chips and the like, the accommodating chamber being located on the cutter side of the table; and
   (e) a vacuum mechanism attached to the accommodating chamber.

8. An apparatus as recited in claim 7, wherein the first surface is an upper surface, the second surface is a lower surface, the supporting pad presses generally downward, and the cutter bores generally upward.

9. An apparatus as recited in claim 8, wherein said knife edge has an obliquely-cut round-bar shape.

10. An apparatus as recited in claim 8, wherein said knife edge has a concave cutting surface.

11. An apparatus as recited in claim 8, wherein said supporting pad has portions defining an air passage therethrough.

12. An apparatus as recited in claim 11, wherein the air passage through said supporting pad has a discharge opening located so that discharged air may impinge on the laminated plate.

13. A boring cutter having an axial center line about which the cutter is operable to be rotated, said boring cutter comprising a cutting element having a modified round-bar shape, said cutter element including a pointed end and an air passage having a discharge opening in the vicinity of said pointed end.

14. The boring cutter of claim 13, wherein the cutting element having a modified round-bar shape comprises a cutting element having an obliquely-cut round-bar shape.

15. The boring cutter of claim 13 wherein the cutting element comprises a cutting element having a concave cutting edge.

16. A method of boring a multi-layered laminated plate comprising the steps of:
   pressing against the plate in one direction;
   boring the plate in a direction generally opposite to the direction in which it is pressed, said boring characterized in that a boring element with a pointed end is withdrawn between boring of each individual layer of the multi-layer plate; and
   blowing air towards the laminated plate in the direction in which it is bored, wherein the blown air passes through an air passage in the boring element having a discharge opening in the vicinity of the pointed end.

17. A method as recited in claim 16 further comprising the step of blowing air toward said laminated plate in a direction in which it is pressed.

18. A method as recited in claim 16 further comprising the step of vacuuming away bored portions of the laminated plate.

19. A boring apparatus for a laminated plate comprising:
   a. a table having a first surface on which a laminated plate may be placed for boring and an opposing second surface, said table defining at least one passage therethrough;
   b. means for urging a laminated plate to be bored toward the first surface of said table; and c. a cutter for boring a laminated plate to be bored, said cutter operable to bore in a direction generally opposite the direction that the means for urging urges and through the passage defined by said table, said cutter comprising:
  i. a cutting element having a pointed end and an axial center line, said cutting element adapted to be rotated about its axial center line, said cutting element further adapted to be moved in both directions along its axial center line;
  ii. means for rotating said cutting element about its axial center line;
  iii. means for moving said cutting element in both directions along its center line; and
  iv. an air passage having a discharge opening in the vicinity of said pointed end.

20. An apparatus as recited in claim 19 wherein said means for rotating said cutting element about its axial center line comprises a motor having a rotating output shaft.

21. An apparatus as recited in claim 20 wherein said motor having a rotating output shaft comprises an air motor having a rotating output shaft.

22. An apparatus as recited in claim 21 further comprising means for connecting the cutting element and the rotating output shaft of the air motor.

23. An apparatus as recited in claim 22 wherein said means for connecting the cutting element and the rotating output shaft of the air motor has an air passage therethrough.

24. An apparatus as recited in claim 19 wherein said means for moving said cutting element in both directions along its axial center line comprises a stepping mechanism.

25. An apparatus as recited in claim 24 wherein said means for rotating said cutting element about its axial center line comprises an air motor having a rotating output shaft.

26. An apparatus as recited in claim 25 further comprises means for connecting the cutting element and the rotating output shaft of the air motor.

27. An apparatus as recited in claim 26 further comprises means for connecting the air motor to the stepping mechanism.

28. An apparatus as recited in claim 27 further comprising a unit box in which the cutting element, air motor, and stepping mechanism are disposed.

29. An apparatus as recited in claim 28 further comprising means for moving said unit box.

30. An apparatus as recited in claim 29 wherein said means for moving said unit box comprises a threaded bar.

31. An apparatus as recited in claim 30 further comprising means for controlling operation of the means for urging and said cutter so that those elements operate in unison.

32. An apparatus as recited in claim 31 wherein said means for controlling comprises a CPU.

33. An apparatus as recited in claim 32 wherein said CPU further controls movement of the unit box.

34. A boring apparatus for a laminated plate comprising:
  a. a table having a first surface on which a laminated plate may be placed for boring and an opposing second surface, said table defining at least one passage therethrough;
  b. a means for urging a laminated plate to be bored towards the first surface of said table;
  c. a supporting pad for urging a laminated plate to be bored toward the first surface of said table;
  d. a cutter for boring a laminated plate to be bored, said cutter operable to bore in a direction generally opposite the direction that the means for urging urges and through the passage defined by said table, said cutter comprising:
    i. a cutting element having a pointed end and an axial center line, said cutting element adapted to be rotated about its axial center line, said cutting element further adapted to be moved in both directions along its axial center line;
    ii. means for rotating said cutting element about its axial center line;
    iii. means for moving said cutting element in both directions along its center line; and
    iv. an air passage having a discharge opening in the vicinity of said pointed end:
  e. elements defining an accommodating chamber for chips and the like; and
  f. a vacuum mechanism attached to the accommodating chamber.

35. An apparatus as recited in claim 34 wherein said means for rotating said cutting element about its axial center line comprises a motor having a rotating output shaft.

36. An apparatus as recited in claim 35 wherein said motor having a rotating output shaft comprises an air motor having a rotating output shaft.

37. An apparatus as recited in claim 36 further comprising means for connecting the cutting element and the rotating output shaft of the air motor.

38. An apparatus as recited in claim 37 wherein said means for connecting the cutting element and the rotating output shaft of the air motor has an air passage therethrough.

39. An apparatus as recited in claim 34 wherein said means for moving said cutting element in both directions along its axial center line comprises a stepping mechanism.

40. An apparatus as recited in claim 39 wherein said means for rotating said cutting element about its axial center line comprises an air motor having a rotating output shaft.

41. An apparatus as recited in claim 40 further comprising means for connecting the cutting element and the rotating output shaft of the air motor.

42. An apparatus as recited in claim 41 further comprising means for connecting the air motor to the stepping mechanism.

43. An apparatus as recited in claim 42 further comprising a unit box in which the cutting element, air motor, and stepping mechanism are disposed.

44. An apparatus as recited in claim 43 further comprising means for moving said unit box.

45. An apparatus as recited in claim 44 wherein said means for moving said unit box comprises a threaded bar.

46. An apparatus as recited in claim 45 further comprising means for controlling operation of the means for urging and said cutter so that those elements operate in unison.

47. An apparatus as recited in claim 46 wherein said means for controlling comprises a CPU.

48. An apparatus as recited in claim 47 wherein said CPU further controls movement of the unit box.

49. An apparatus for boring a laminated plate comprising:

(a) a table having an upper surface on which a laminated plate may be placed for boring and an opposing lower surface, said table defining at least one passage therethrough;

(b) a supporting pad for downwardly urging a laminated plate to be bored towards the first surface of said table, said supporting pad including portions defining an air passage therethrough; and (c) a cutter for boring a laminated plate to be bored, said cutter operable to bore in a generally upward direction and through the passage defined by said table, said cutter comprising:
  (i) a knife edge;
  (ii) a pivotal mechanism having an axial center line, said pivotal mechanism adapted to be pivoted about its axial center line; and
  (iii) a stepping mechanism for moving the knife edge in one direction and successively further in a second direction so that successively deeper boring may be performed.

50. An apparatus as recited in claim 49, wherein said knife edge has an obliquely-cut round-bar shape.

51. An apparatus as recited in claim 49, wherein said knife edge has a concave cutting surface.

52. An apparatus as recited in claim 49, wherein said knife edge has portions defining an air passage therethrough.

53. An apparatus as recited in claim 52, wherein said knife edge has a cutting point and the air path has a discharge opening in the vicinity of the cutting point of the knife edge.

54. An apparatus as recited in claim 49, wherein said the air passage through said supporting pad has a discharge opening located so that discharged air may impinge on the laminated plate.

55. An apparatus for boring a laminated plate comprising:
  (a) a table having an upper surface on which a laminated plate may be placed for boring and an opposing lower surface, said table defining at least one passage therethrough;
  (b) a supporting pad for downwardly urging a laminated plate to be bored towards the first surface of said table, said supporting pad has portions defining an air passage therethrough; and
  (c) a cutter for boring a laminated plate to be bored, said cutter operable to bore in a generally upward direction and through the passage defined by said table, said cutter being located on a cutter side of the table, said cutter comprising:
    (i) a knife edge,
    (ii) a pivotal mechanism having an axial center line, said pivotal mechanism adapted to be pivoted about said axial center line, and
    (iii) a stepping mechanism for moving the knife edge in one direction and successively further in a second direction so that successively deeper boring may be performed;
  (d) elements defining an accommodating chamber for chips and the like, the accommodating chamber being located on the cutter side of the table; and
  (e) a vacuum mechanism attached to the accommodating chamber.

56. An apparatus as recited in claim 55, wherein said knife edge has an obliquely-cut round-bar shape.

57. An apparatus as recited in claim 55, wherein said knife edge has a concave cutting surface.

58. An apparatus as recited in claim 55, wherein said knife edge has an air path therethrough.

59. An apparatus as recited in claim 58, wherein said knife edge has a cutting point and the air path has a discharge opening in the vicinity of the cutting point of the knife edge.

60. An apparatus as recited in claim 59, wherein the air passage through said supporting pad has a discharge opening located so that discharged air may impinge on the laminated plate.

* * * * *

UNITED STATES PATENT AND TRADEMARK OFFICE
CERTIFICATE OF CORRECTION

PATENT NO. : 4,909,678

DATED : March 20, 1990

INVENTOR(S) : M. KAKIMOTO

It is certified that error appears in the above-identified patent and that said Letters Patent is hereby corrected as shown below:

Front page, the drawing is not from the original disclosure of the application for this patent, was not filed during prosecution of the application, and is not part of the Inventor's invention.

Column 1, line 56, after chips, change "of" to ---or---.
Column 6, line 50, after "4", insert ---,---.
Column 8, line 10, change "Aa"" to ---Aa'---.
Column 8, line 63, change "from" to ---forms---.
Column 9, line 68, in the seventeenth line of claim 7, change ":" to ---;---.

Signed and Sealed this

Twenty-second Day of September, 1992

Attest:

DOUGLAS B. COMER

*Attesting Officer*    *Acting Commissioner of Patents and Trademarks*